United States Patent [19]

Wright

[11] 4,422,047

[45] Dec. 20, 1983

[54] SOLID STATE AUTOTUNE POWER AMPLIFIER

[75] Inventor: William A. Wright, Fairfax Station, Va.

[73] Assignee: E-Systems, Inc., Dallas, Tex.

[21] Appl. No.: 324,223

[22] Filed: Nov. 23, 1981

[51] Int. Cl.³ .................. H03F 3/191; H03G 3/30; H04B 1/04
[52] U.S. Cl. ........................ 330/51; 330/279; 330/298; 330/305; 455/73; 455/115
[58] Field of Search ............ 330/2, 51, 279, 298, 330/305; 455/77, 103, 120, 73, 115

[56] References Cited

U.S. PATENT DOCUMENTS 4,165,493  8/1979  Harrington ............... 455/115 X

*Primary Examiner*—James B. Mullins

*Attorney, Agent, or Firm*—Robert V. Wilder; Albert M. Crowder, Jr.

[57] ABSTRACT

A solid state, band-pass filtered, RF power amplifier for equalizing the response of an amplified RF signal across the entire tuning range of a multi channel transmitter is disclosed. An RF signal is applied to the input of a low noise FET amplifier with a portion of the signal coupled off into a frequency counter which in conjunction with a digital switching logic selects a path through a band-pass filter having characteristics that reduce the broadband noise of the RF signal passed therethrough. Additionally, a dual directional coupler samples the output of the power amplifier with the forward sampled signal being used to control the amplifier output to a preselected level and the reverse sampled signal being used to reduce the amplifier output signal in proportion to an increase in the voltage standing wave ratio load between the amplifier and the transmit/receive switch.

10 Claims, 6 Drawing Figures

TYPICAL BPF CIRCUIT
CONFIGURATION

TYPICAL LPF CIRCUIT CONFIGURATION

4,422,047

SOLID STATE AUTOTUNE POWER AMPLIFIER

TECHNICAL FIELD

This invention relates to RF Power Amplifiers, and more particularly to a solid-state, band-pass filtered, RF power amplifier with autotune capabilities for providing equal response across the entire RF spectrum covered by a plurality of transmission channels of a radio transmitter.

BACKGROUND ART

The use of automatic tuning circuits to enhance the response of a multi-channel RF transmitter circuit has been widely described in the prior art. In general, however, such systems are directed to automatic tuning systems which electromechanically vary capacitance and inductance in response to detected phase differences.

Additionally, automatic switching has been utilized to match the output impedance of transmitter circuits to that of a particular antenna. Again, these are generally directed to electromechanically varying the capacitance or inductance or by electromechanically inserting fixed parameter capacitors and inductors to form a specific LC network circuit between the output of a power amplifier and an antenna transmit/receive switch.

In those instances where attention has been directed to tuning the power amplifier for band-pass filtering, the tunable filter has, in general, been designed around a three gang variable inductor and a band select switch which is incorporated as part of the accompaning transmitter. The tuning of these components is controlled by mechanical linkages which permitted sufficient filtering to enable the equipment to be set up for re-transmission and co-located operation.

More recently the prior art has been directed to the use of solid state devices with their operational speed advantage. Unfortunately, due to the low Q inherent in solid state devices the problems of selectivity has limited the use of such devices in multi-megacycle bandwidth applications.

Accordingly, there is a need for a solid state automatically tunable power amplifier which will provide very selective filtering across a multi Megahertz range to reduce broad band noise to a level that will permit re-transmission and co-located operation of the transceiver. Additionally, to enhance equalization of the output signal across the spectrum covered by the multiple channels of the transmitter, a requirement exists for an automatic level control which controls the output of the power amplifier to a preset level and reduces the output power there if in relation to an increase in the voltage standing wave ratio (VSWR) load of the system.

DISCLOSURE OF THE INVENTION

The present invention is directed to a solid state, automatic tuning, RF power amplifier designed for use in connection with multi channel radio transmitters covering multiple Megahertz ranges.

In accordance with preferred embodiment of the invention, a transmitter output frequency is detected and used to switch a power band pass filter specific for the detected frequency into the power amplifier circuit. Coupling the detected frequency through the selected filter eliminates broad band noise prior to amplification thereof. More specifically, the RF input to a low noise FET amplifier is sampled by an isolated frequency counter, the output of which is used to switch an appropriate bandpass filter into the power amplifier circuit as well as to switch the output of the amplifier into a low pass filter above a pre-determined frequency to prevent harmonic interference adajcent high frequency signal circuits. The output of the low noise FET amplifier is coupled through the selected bandpass filter and into a pushpull power amplifier. The amplified signal is in turn coupled into a transmit/receive switch. Forward and reverse feedback signals are coupled off of the amplified signal outputed and coupled into an output level control which controls the amplification of the low noise FET amplifier in functional relation to a preselected output level and a voltage standing wave ratio load. Additionally, a selectable low power output mode of operation is provided in the embodiment.

BRIEF DESCRIPTION OF THE DRAWINGS

For a more complete understanding of the present invention and the advantages thereof, reference is now made to the following description taken in conjunction with the accompanying diagrams in which.

DETAILED DESCRIPTION

The present invention is directed to automatically tunning a power amplifier to provide equal response across all channels of a multichannel high frequency radio transmitter. By detecting the RF signal frequency of the transmitter, a band pass filter having characterisitcs matched to the RF signal frequency may be automatically selected from a number of band pass filters, each having separate characteristics which collectively cover the multiple Megahertz bandwidth of all channels of the radio transmitter. The selected filter is automatically inserted into the power amplifier with the RF signal being coupled through the filter to reduce broadband noise and aid in equalizing the response across the filter.

Additionally, a control signal is derived from the output of the power amplifier and used to maintain a preselected signal level output and to provide for a reduced power output upon the occurance of an increase in the voltage standing wave ratio (VSWR) load of the transmitter circuit.

Figure 1:
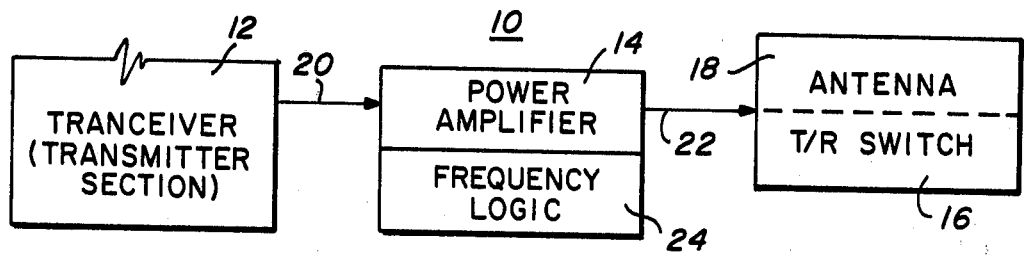
FIG. 1 is a block diagram illustrating the transmit circuit of a typical transceiver and employing the autotune power amplifier of the present invention.

Referring now to FIG. 1, there is shown the transmitter section of a multichannel radio transceiver 10. Transmitter 12 provides selective tuning to permit generation of an RF carrier signal falling within a multiple megahertz bandwidth capability of the transmitter. The RF signal is coupled via conductor 20 into the input of a power amplifier 14 where the signal is amplified and then coupled via conductor 22 into a transmit/receive switch 16 which, during the transmit mode of operation, couples the amplified RF signal into an antenna 18 for transmission.

Figure 2:
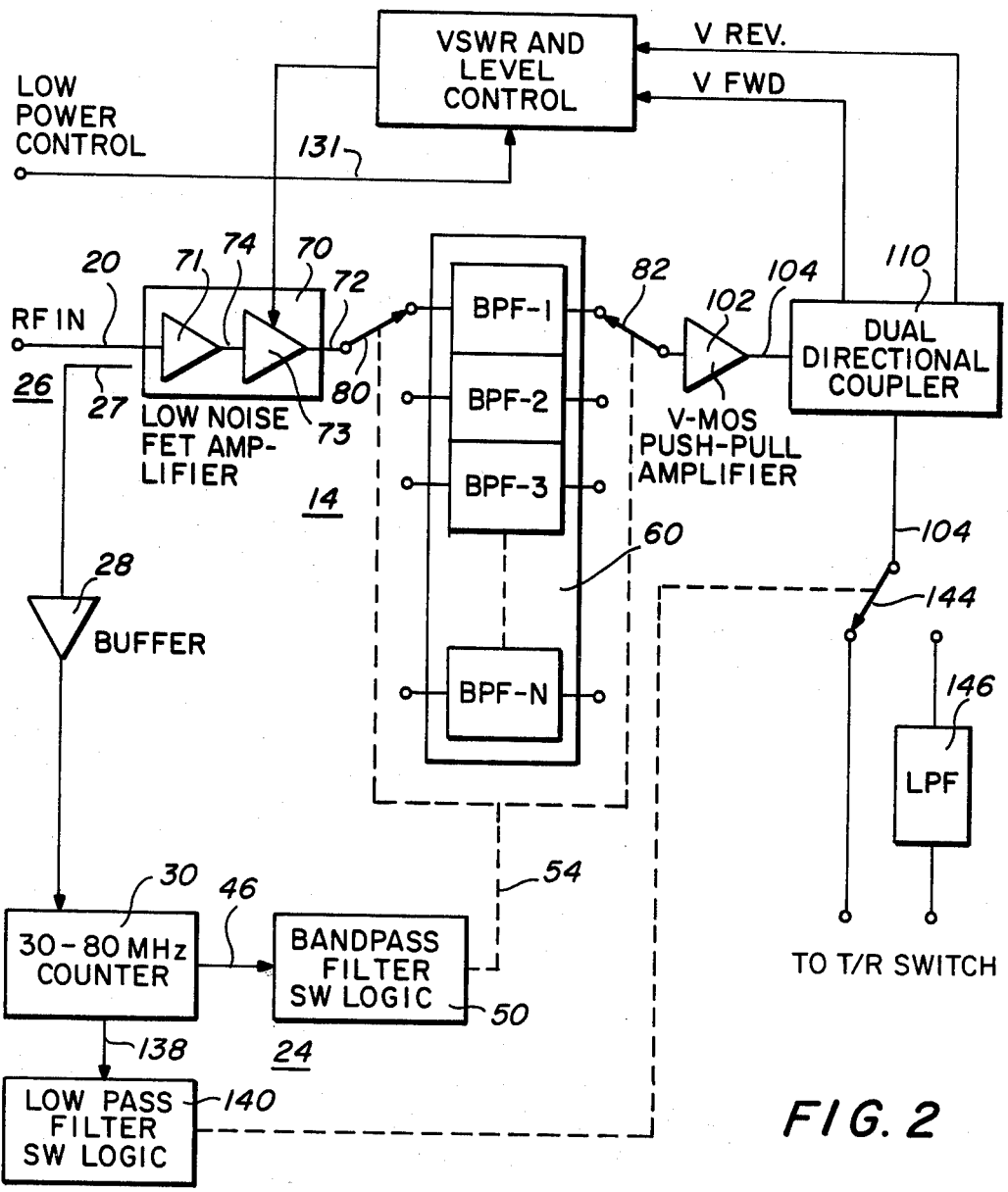
FIG. 2 is a block diagram of the autotune power amplifier of the present invention.
Figure 3:
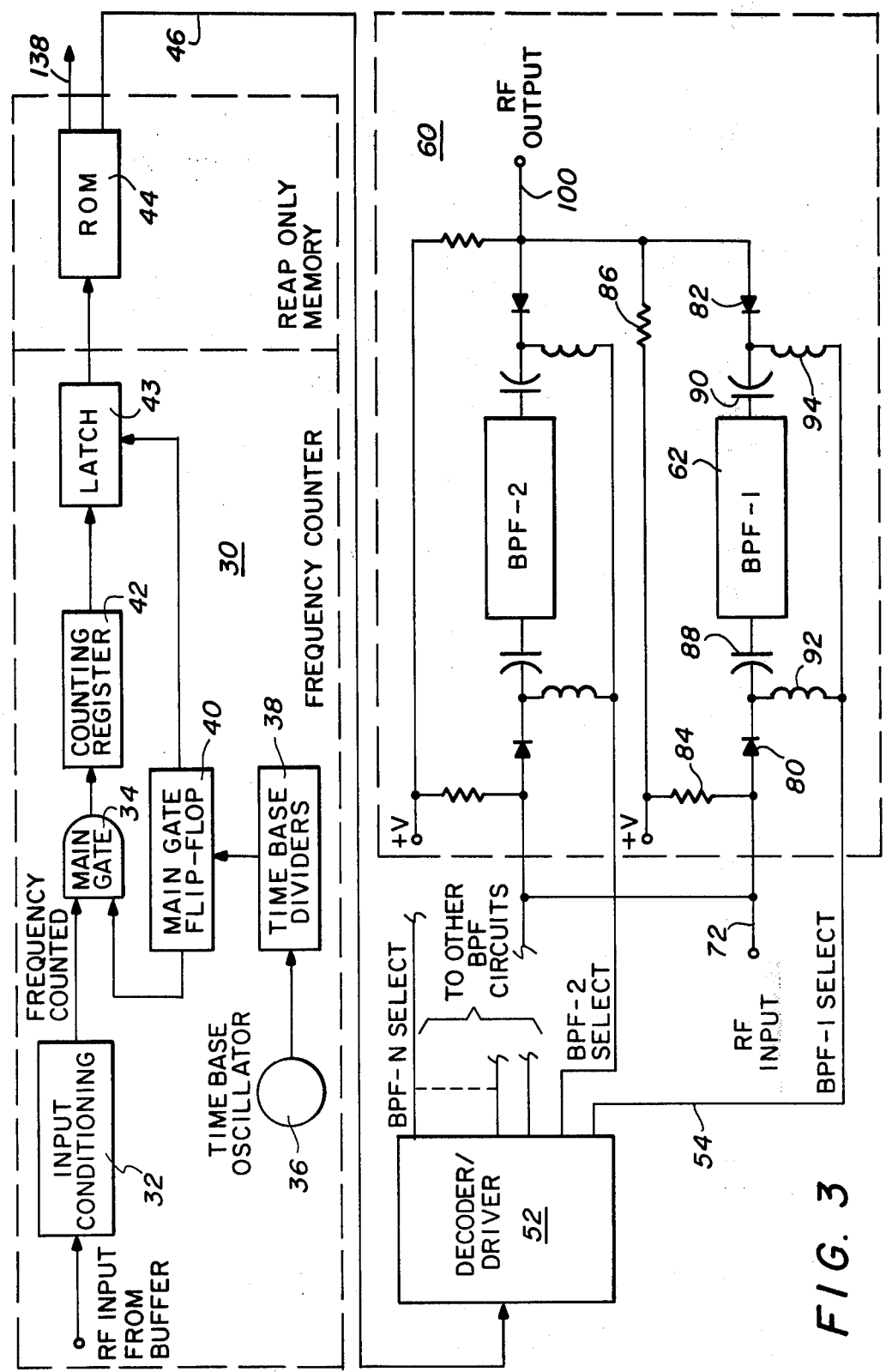
FIG. 3 is a block diagram of the frequency logic circuit of the autotune power amplifier of the present invention, including a schematic representation of the solid state band-pass filter switching logic.

As will be hereinafter described in greater detail, a frequency detection and switching logic circuit 24 is interconnected to power amplifier 14 to permit the automatic frequency detection and accompanying automatic band-pass filter switching forming a portion of the present invention. Referring also the FIG. 2, transmitter 12 is operated to generate an RF signal at a preselected frequency. This signal is coupled into power amplifier 14 via conductor 20 which passes through RF coupler 26. A portion of the RF signal is coupled off from conductor 20 by RF coupler pick-up 27 and inputted into buffer 28 which provides gain for the coupled RF signal and isolation to prevent spurous signals and noise from coupling back through RF coupler 27 to interfere with the RF signal present on conductor 20. The RF signal outputted from buffer 28 is coupled into a frequency counter 30. Referring also to FIG. 3, the RF signal from buffer 28 is coupled through a signal conditioning circuit 32 into one input of a digital gate 34. A time base oscillator 36 generates a fixed clock signal which is coupled into time base divider 38 to provide the necessary clock timing for operation of the frequency timer 30. A clock signal is then coupled from divider 38 to the remaining input of gate 34 through main gate flip-flop 40. The clock signal applied on gate 34 acts to step the RF signal through into counting register 42, where each frequency cycle increment the count 42 in a predetermined manner, to provide a digital count signal functionally related to the RF frequency signal.

An additional clock signal developed in main gate flip-flop 40 is coupled into latch 43 to provide the timing necessary to permit transfer of the accumulated count present in register 42 into the read only memory 44. Read only memory 44 is programed to receive the frequency counts from latch 44 and translate each count into a specific encoded address which is then transferred as a digital address over conductor 46, into bandpass filter switching logic 50 where it is inputted into a decoder/driver 52 which decodes the digital address and, in accordance therewith, selects one of N bandpass filter (BPF) select lines 54 which are connected to band-pass filter module 60 containing N band-pass filters.

Figure 4:
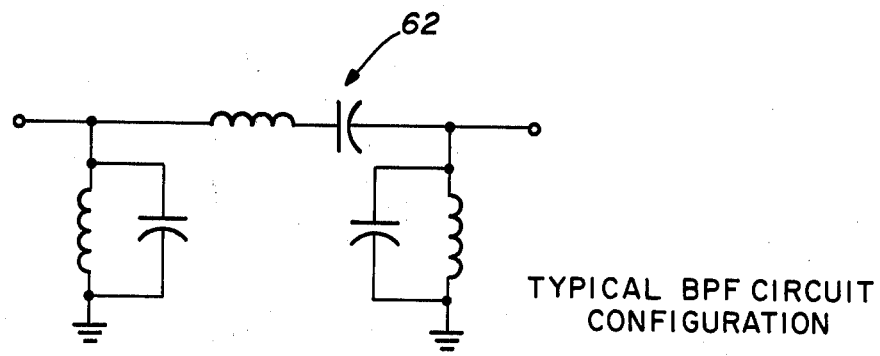
FIG. 4 is a schematic illustration of a typical band-pass filter circuit utilizing a constant K, $\pi$ section configuration.

Each of these filters is (and referring now to FIG. 4) a constant K, $\pi$ section band-pass filter having preselected characteristics for equalizing the response of one of the multiple RF signal frequencies which can be generated by transmitter 12. The RF signal which is present on conductor 20, is coupled through a low noise FET amplier 70, the operation of which will be described hereinafter in greater detail, and coupled via conductor 72 into the selected band pass filter contained in filter module 60.

As selection of the proper band pass filter is a function of the frequency of the RF signal generated by transmitter 12, the operation of the select circuit to insert the proper band pass filter into the line to receive the RF signal will be described only one filter unit. It is to be understood, however, that module 60 can contain up to N separate bandpass filters 62, each having different frequencies response characteristics.

Upon decoding the BPF address form ROM 44, the driver section of decoder/driver 52 selects the addressed lines, driving them to a law state. As decoder/driver 52 drives band-pass filter select line 54 (BPF-1 select) to a low state, a +V/dc voltage signals acts through resistors 84 and 86 to produce a forward bias current respectively through pin diodes 80 and 82 at the input and output respectively of band pass-filter BPF-1. This bias current creates a low resistance or ON state driving pin diodes 80 and 82 into conduction, which permits the RF signal inputed on conductor 72 to be coupled into band-pass filter BPF-1 via pin diodes 80 and across capacitor 88. The RF signal is outputted from BPF-1 across capacitor 90 and, via pin diode 82, into a V-MOS push-pull amplifier 102.

Capacitors 88 and 90 are connected in-line to isolate band-pass filter BPF-1 by preventing the +V DC voltage from being impressed there across. Additionally, radio frequency chokes 92 and 94 are provided in each BPF-N select lines to prevent the RF signal coupled into the selected BPF from feeding back into the decoder/driver 52. As above mentioned, the select operation for any particular band-pass filter is the same, with only the band-pass characteristics of each circuit 62 being different.

Referring again to FIG. 2, the filtered RF signal is coupled into a V-MOS push pull amplifier 102 for amplification of the signal to a preselected level. The amplified signal is then coupled via conductor 104 through a dual directional coupler 110.

Figure 5:
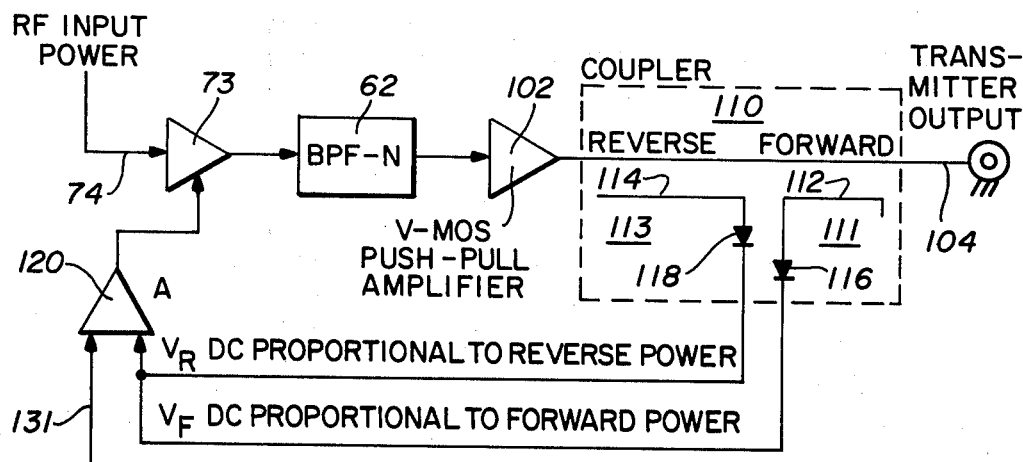
FIG. 5 is a partially in schematic block diagram illustrating the VSWR and level control circuit of the autotune power amplifier of the present invention.
Figure 5:
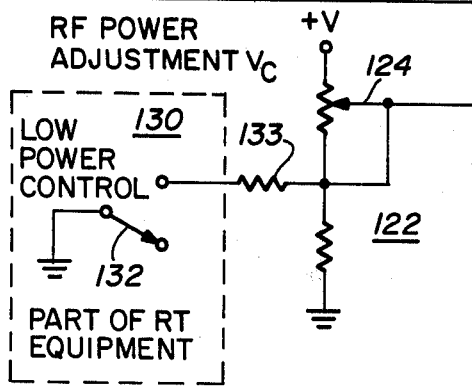

Referring now to FIG. 5, a detector 111, including a pick-up 112 and a diode 116, senses the RF signal present on conductor 104 passing through coupler 110 to produce a DC voltage ($V_f$) proportional to the magnitude of the RF signal present on conductor 104. Similarly, another detector 113 including a reverse pick-up 114 and a diode 118, are used to produce a DC voltage ($V_R$) proportional to the magnitude of any voltage standing wave ratio (VSWR) load present in the transmitter circuit 10.

$V_F$ is functionally related to the output power and is coupled into one input of a different amplifier 120. $V_f$ is used to control the magnitude of the RF signal power outputted from power amplifier 14 in the following manner. A resistance network 122 containing a potentiometer 124 provides a means by which a DC reference voltage (+V) may be developed and coupled into the remaining input of differential amplifier 120. During operation, potentiometer 124 is adjusted to produce, in conjunction with $V_F$, a voltage signal which is functionally related to the power of the RF signal outputted from power amplifier 14.

The differential amplifier 120 output signal is coupled into the second stage 73 of low noise FET amplifier 70. This signal sets the level of amplification within amplifier 70 to produce a output signal having a magnitude sufficient to produce the desired power amplifier output signal magnitude. Any increase or decrease in the output signal of differential amplifier 120 results in a respective increase or decrease in the gain of FET amplifier 70.

The $V_R$ signal is proportional to the reverse power sensed in coupler 110 and is a measure of the voltage standing wave ratio (VSWR) load of transmitting system 10. $V_R$ is coupled into the same input port of differential amplifier 120 as is the $V_F$ signal. In operation, as the VWSR decreases the DC voltage $V_R$ increases, causing a decreased signal output from differential amplifier 120. This decreased output causes a decrease in the amplification of FET amplifier 70. This results in a reduced power output of the power amplifier 14, which reduction is proportional to the increase in the VSWR load of the circuit 10. By thus decreasing the power output of circuit 10 in response to increasing VSWR, the operational stability of the circuit is enhanced.

Additionally, at times it is desired to operate the transmitter system in a reduced power mode. Accordingly, a low-power select control 130 incorporating a switch 132 is included. As determination of the power output mode is a function of selection in transmitter 12, switch 132 may be the contacts of a relay contained within transmitter 12 which, when energized, directs a portion of the DC voltage level developed across resistance networks 122 through a resistance 133 to ground. This grounding of a portion of the DC reference signal decreases the voltage signal inputted into differential amplifier 120, with an accompanying decrease in the control signal applied to second stage 73 of FET amplifier 70 and with an attendant reduction in power outputed from power amplifier 14.

Figure 6:
FIG. 6 is a schematic representation of a typical low pass filter circuit in a cascaded network configuration utilized in connection with the autotune power amplifier of the present invention.

Additionally, for frequencies in excess of 50 megahertz an additional filter 146 is included to provide filtering for low band-pass frequencies which can create harmonic interference to communications in other operating system above 100 megahertz. Referring now to FIGS. 2 and 3, the read only memory (ROM) 44 of frequency counter 30 provides an output via conductor 138 which is coupled into low pass filter switch logic 140. Switch logic 140 detects when the frequency count reaches 50 megahertz and operates switch 144 to insert a low pass filter 146 (refer to FIG. 6 for a typical low pass filter circuit configuration) between the output of power amplifier 14 and transmit/receive switch 16. Although not shown in detail, it is envisioned that a typical embodiment of switch 144 will incorporate a pin diode switch arrangement similar to that as above described for operation of the pin diode switchs 80 and 82 contained in the band-pass filter select circuits.

While certain types of logic have been described herein by way of example, it is understood that the actual hardware used will be dictated by operating frequencies, power requirements, and characteristics of the system in which the power amplifier is to be used.

Although particular embodiments of the invention have described herein it will be understood that the invention is not limited to the embodiments disclosed but is capable of rearrangement, modification and substitution of parts and elements without departing from the spirit of the invention.

I claim:

1. A method of automatically tuning an R.F. power amplifier to the R.F. signal generated in a multichannel radio transmitter and applied to the input of the R.F. power amplifier so as to provide equal response across all transmission channels of the radio transmitter, comprising the steps of:
   (a) determining the frequency of the R.F. signal;
   (b) automatically selecting one of a plurality of band pass filters (BPF) having separate band-pass characteristics which collectively cover the bandwidth of all channels of the radio transmitter, basing said selection on said frequency determination;
   (c) passing the RF signal through said selected BPF for reducing broadband noise;
   (d) amplifing said filtered RF signal to a preselected level;
   (e) sampling said amplified and filtered RF signal; and
   (f) controlling the magnitude of said amplified and filtered RF signal with said sample and in functional relation to said preselected level and a Voltage Standing Wave Ratio (VSWR) load of the RF power amplifier.

2. The method of claim 1, wherein said step of automatically selecting said one band-pass filter further comprises the steps of:
   (a) producing a frequency count representative of the frequency of the RF signal;
   (b) producing a digitally encoded address signal representative of said frequency count; and
   (c) enabling an input and an output switch in response to said address signal for selecting said one band-pass filter.

3. The method of claim 2, wherein said step of enabling said input and said output switch further comprises the steps of:
   (a) changing the signal level on a select line associated with said input and output switches;
   (b) forward biasing a first pin diode to an active state in response to said signal level change for providing an input path for the RF signal into said selected band-pass filter; and
   (c) forward biasing a second pin diode to an active state in response to said signal level change for providing an output path for the RF signal from said selective band pass filter.

4. The method of claim 1, wherein said step of sampling said amplified and filtered RF signal further comprises the steps of:
   (a) sampling said amplified and filtered RF siganl in a forward direction with respect to the RF signal path
   (b) developing a first dc voltage level proportional to the magnitude of said forward sampled RF signal;
   (c) sampling said amplified and filtered RF signal in a reverse direction with respect to the RF signal path;
   (d) developing a second dc voltage level proportional to the magnitude of reverse current caused by said VSWR load of the RF power amplifier;
   (e) providing a dc reference voltage level;
   (f) comparing said first dc voltage level with said dc reference voltage level for developing a first differential control signal for controlling the magnitude of said amplified and filtered RF signal at said preselected level; and
   (g) comparing said second dc voltage level with said dc reference voltage level for developing a second differential control signal for reducing the magnitude of said preselected level in response to an increase in said VSWR load of the RF power amplifier.

5. The method of claim 3, wherein said step of sampling said amplified and filtered RF signal further comprises the steps of:
   (a) sampling said amplified and filtered RF signal in a forward direction with respect to the RF signal path;
   (b) developing a first dc voltage level proportional to the magnitude of said forward sampled RF signal;
   (c) sampling said amplified and filtered RF signal in a reverse direction with respect to the RF signal path;

(d) developing a second dc voltage level proportional to the magnitude of reverse current caused by said VSWR load of the RF power amplifier;

(e) providing a dc reference voltage level;

(f) comparing said first dc voltage level with said dc reference voltage level or developing a first differential control signal for controlling the magnitude of said amplified and filtered RF signal at said preselected level; and (g) comparing said second dc voltage level with said dc reference voltage level for developing a second differential control signal for reducing the magnitude of said preselected level in response to an increase in said VSWR load of the RF power amplifier.

6. An automatically tuned, solid-state R.F. power amplifier responsive to an R.F. signal generated in a multichannel radio transmitter to automatically tune the amplifier to provide equal response across all channels of the radio transmitter, comprising:

(a) means for determining the frequency of an RF signal inputted into the RF power amplifier;

(b) means responsive to said frequency determining means for automatically selecting one of a plurality of bandpass filters (BPF's) having separate bandpass characteristics which collectively cover the bandwidth of all channels of the radio transmitter and thereafter coupling the RF signal through said selected one BPF for filtering and reducing broadband noise;

(c) an amplifier connected to said selected one BPF and operative to receive and amplify said filtered RF signal to a preselected level and outputting said amplified RF signal;

(d) means responsive to said outputted amplified RF signal for controlling the amplitude thereof in functional relation to said preselected level and a voltage standing wave ratio (VSWR) load of the RF power amplifier.

7. The amplifier of claim 6, wherein said frequency determining means comprises:

(a) a coupler operative to provide a sample of the RF signal inputted into the amplifier;

(b) a counter connected to said coupler and responsive to said sample to produce a count representative of the frequency of the RF signal;

(c) an encoder responsive to said frequency count to produce a digitally encoded address signal;

(d) selection means for enabling an input and an output switch in response to said digitally encoded address signal for selecting said one BPF.

8. The amplifier of claim 7, wherein said selection means comprises:

(a) a decoder/driver connected to said encoder for receiving said digitally encoded address signal and selecting one of a plurality of select lines in response thereto, said decoder/driver operative to change the signal level present on said selected one select line; and (b) one of a plurality of pin diode pairs, one diode of said pair connected to an input and the remaining diode of said pair connected to an output of said selected one BPF, each diode said one pin diode pair being forward biased when the signal level on said one select line is changed, said diode pair operative to provide a signal path for the RF signal through said one BPF.

9. The amplifier of claim 6, further including:

(a) first sample means proximate to the output of said amplifier and operative to sample said amplified RF signal and develop and output a first dc control signal functionally related to the signal level of said amplified RF signal;

(b) second sample means proximate to the output of said amplifier and operative to sample said amplified RF signal and develop and output a second dc control signal functionally related to the VSWR load reflected in said amplified RF signal;

(c) a source of a dc reference voltage;

(d) a differential amplifier having a first input connected to said dc reference voltage source and a second input connected to said dc control signal outputs of said first and second sample means, said differential amplifier operative to develop a differential control signal; and (e) means responsive to said differential control signal for controlling the magnitude of said amplified RF signal at said preselected level in relation to the magnitude of said first dc control signal and reducing the magnitude of said amplified RF signal in relation to the magnitude of said second dc control signal.

10. The amplifier of claim 8, further including:

(a) first sample means proximate to the output of said amplifier and operative to sample said amplified RF signal and develop and output a first dc control signal functionally related to the signal level of said amplified RF signal;

(b) second sample means proximate to the output of said amplifier and operative to sample said amplified RF signal and develop and output a second dc control signal functionally related to the VSWR load reflected in said amplified RF signal;

(c) a source of a dc reference voltage;

(d) a differential amplifier having a first input connected to said dc reference voltage source and a second input connected to said dc control signal outputs of said first and second sample means, said differential amplifier operative to develop a differential control signal; and (e) means responsive to said differential control signal for controlling the magnitude of said amplified RF signal at said preselected level in relation to the magnitude said first dc control signal and reducing the magnitude of said amplified RF signal in relation to the magnitude of said second dc control signal.

* * * * *